US007085184B1

(12) United States Patent
Walther et al.

(10) Patent No.: US 7,085,184 B1
(45) Date of Patent: Aug. 1, 2006

(54) DELAYED BITLINE LEAKAGE COMPENSATION CIRCUIT FOR MEMORY DEVICES

(75) Inventors: Steven T. Walther, Mountain View, CA (US); Scott B. Kuusinen, Sunnyvale, CA (US); Sameer D. Halepete, San Jose, CA (US)

(73) Assignee: nVidia Corporation, Santa Clara, CA (US)

(*) Notice: Subject to any disclaimer, the term of this patent is extended or adjusted under 35 U.S.C. 154(b) by 42 days.

(21) Appl. No.: 10/951,825

(22) Filed: Sep. 27, 2004

(51) Int. Cl.
*G11C 7/00* (2006.01)
*G11C 7/10* (2006.01)

(52) U.S. Cl. .................. 365/203; 365/204; 365/207; 365/189.08

(58) Field of Classification Search ............. 365/203, 365/204, 207, 189.08
See application file for complete search history.

(56) References Cited

U.S. PATENT DOCUMENTS 6,160,748 A * 12/2000 Kumar ................. 365/205
6,501,687 B1 * 12/2002 Choi ................. 365/189.11
6,801,463 B1 * 10/2004 Khellah et al. ............. 365/203

* cited by examiner

*Primary Examiner*—Tuan T. Nguyen
*Assistant Examiner*—Toan Le

(57) ABSTRACT

A delayed bitline leakage compensation circuit for memory devices is disclosed. The delayed bitline leakage compensation circuit includes a bitline leakage model circuit for modeling discharge of a bitline by leakage current in a read operation. It further has a delayed charge signal generator for generating a delayed charge signal in response to the bitline leakage model circuit discharging to approximately a discharge threshold. The delayed charge signal generator is deactivated if the bitline is discharged by a selected memory cell. Moreover, the delayed bitline leakage compensation circuit includes a delayed charge circuit for charging the bitline in response to the delayed charge signal.

39 Claims, 7 Drawing Sheets

DELAYED BITLINE LEAKAGE COMPENSATION CIRCUIT FOR MEMORY DEVICES

BACKGROUND OF THE INVENTION

1. Field of the Invention

Embodiments of the present invention generally relate to memory devices. More particularly, embodiments of the present invention relate to delayed bitline leakage compensation circuits for memory devices.

2. Related Art

The storage capacity of memory devices continues to improve. This improvement is largely attributable to reduction in the minimum size of electrical components such as transistors, capacitors, and resistors, due to advanced semiconductor fabrication processes.

FIG. 1 illustrates a conventional memory device 100. As depicted in FIG. 1, the conventional memory device 100 includes a plurality of wordlines 10a–10d, a plurality of bitlines 20a–20c, and a plurality of memory cells 30a–30l. The wordlines 10a–10d are coupled to rows of memory cells while the bitlines 20a–20c are coupled to columns of memory cells. When a wordline is enabled, the memory cells coupled to the enabled wordline are provided access to bitline(s) coupled to these memory cells. Typically, the conventional memory device 100 supports read operations (where a bit is read from a memory cell) and write operations (where a bit is stored in a memory cell). Usually, the bit is either a "1" representing a logic high or a "0" representing a logic low.

Continuing with FIG. 1, the conventional memory device 100 has a plurality of precharge transistors 60a–60c, a plurality of sense amplifiers 40a–40c, and a plurality of keeper transistors 50a–50c. In this configuration, each bitline 20a–20c is coupled to a precharge transistor, a sense amplifier, and a keeper transistor. Moreover, the sense amplifiers 40a–40c are implemented as inverters. The precharge transistors 60a–60c and keeper transistors 50a–50c are implemented as PMOS transistors.

For a read operation, the bitlines 20a–20c are precharged to a predetermined value by the precharge transistors 60a–60c activated by a precharge bitline signal 70. For example, the predetermined value may be "1" (logic high). The keeper transistors 50a–50c provide noise immunity and help to maintain the bitlines 20a–20c at the predetermined value. If the predetermined value is "1" (logic high), each output of the sense amplifiers 40a–40c is "0" (logic low).

Then, one of the wordlines 10a–10d is enabled. The memory cells coupled to the enabled wordline (e.g., wordline 10a) are provided access to the bitlines 20a–20c. For instance, if memory cell 30a starts to discharge bitline 20a, the sense amplifier 40a will sense this discharge at its input and will change its output from a "0" (logic low) to a "1" (logic high), turning off the keeper transistor 50a. Hence, a "1" is provided as the output from bitline 20a for the read operation. On the other hand, if memory cell 30a does not discharge bitline 20a, the sense amplifier 40a will maintain its output at a "0" (logic low), assisted by the keeper transistor 50a. Hence, a "0" is provided as the output from bitline 20a for the read operation.

Ideally, the memory cells 30b–30d should not affect the bitline 20a since wordlines 10b–10d have not been enabled. However, instead of simply being in an off state, the memory cells 30b–30d also discharge the bitline 20a due to leakage current. Although the leakage current is small relative to the current available when the memory cell is in an on state when selected via a wordline, the leakage current is increasing as the size of the transistors is reduced. This leakage current can discharge the bitline 20a even though the selected memory cell 30a does not discharge bitline 20a. Additionally, the greater the number of memory cells coupled to the bitline 20a the greater the likelihood that the unselected (off state) memory cells will discharge the bitline 20a sufficiently to cause the sense amplifier 40a to undesirably sense this discharge at its input and to undesirably change its output from a "0" (logic low) to a "1" (logic high), turning off the keeper transistor 50a. Thus, an erroneous or false "1" will be provided as the output from bitline 20a for the read operation when the output should have been "0".

Solutions to this leakage current problem have focused on resizing the keeper transistor and have been inefficient. Because of cost and limited space, it is difficult to make the keeper transistor large enough to counteract the bitline discharge caused by the leakage current. Moreover, the greater the size of the keeper transistor the slower the bitline is discharged by a selected memory cell, leading to performance issues.

SUMMARY OF THE INVENTION

A delayed bitline leakage compensation circuit for memory devices is disclosed. The delayed bitline leakage compensation circuit includes a bitline leakage model circuit for modeling discharge of a bitline by leakage current in a read operation. It further has a delayed charge signal generator for generating a delayed charge signal in response to the bitline leakage model circuit discharging to approximately a discharge threshold. The delayed charge signal generator is deactivated if the bitline is discharged by a selected memory cell. Moreover, the delayed bitline leakage compensation circuit includes a delayed charge circuit for charging the bitline in response to the delayed charge signal.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

It should be understood that the present invention is applicable to various types and configurations of memory devices (e.g., RAM, ROM, Video RAM, single-ended bitline, differential bitlines, single port memory cell, multiple port memory cell, etc.).

Figure 1:
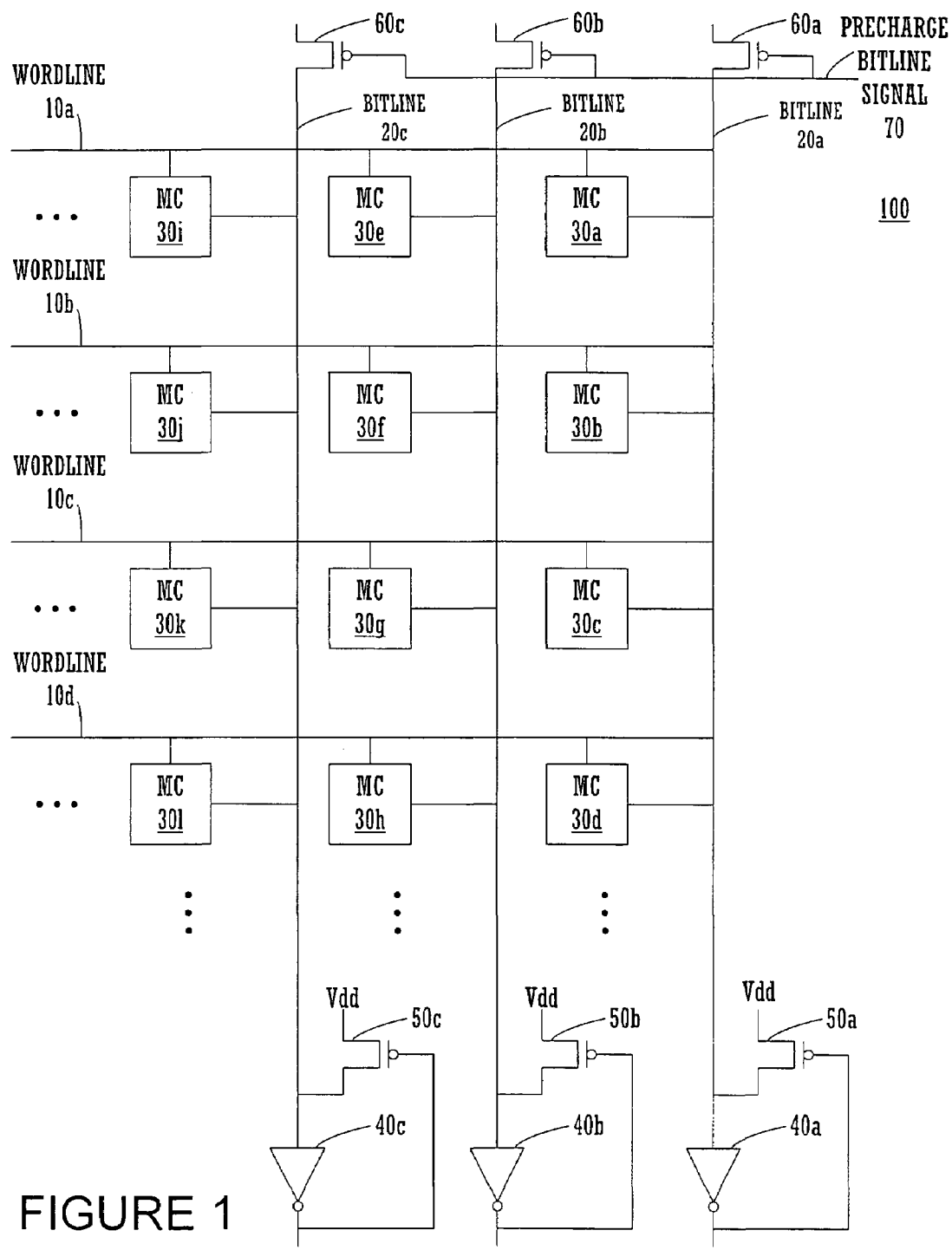
FIG. 1 illustrates a conventional memory device.
Figure 2:
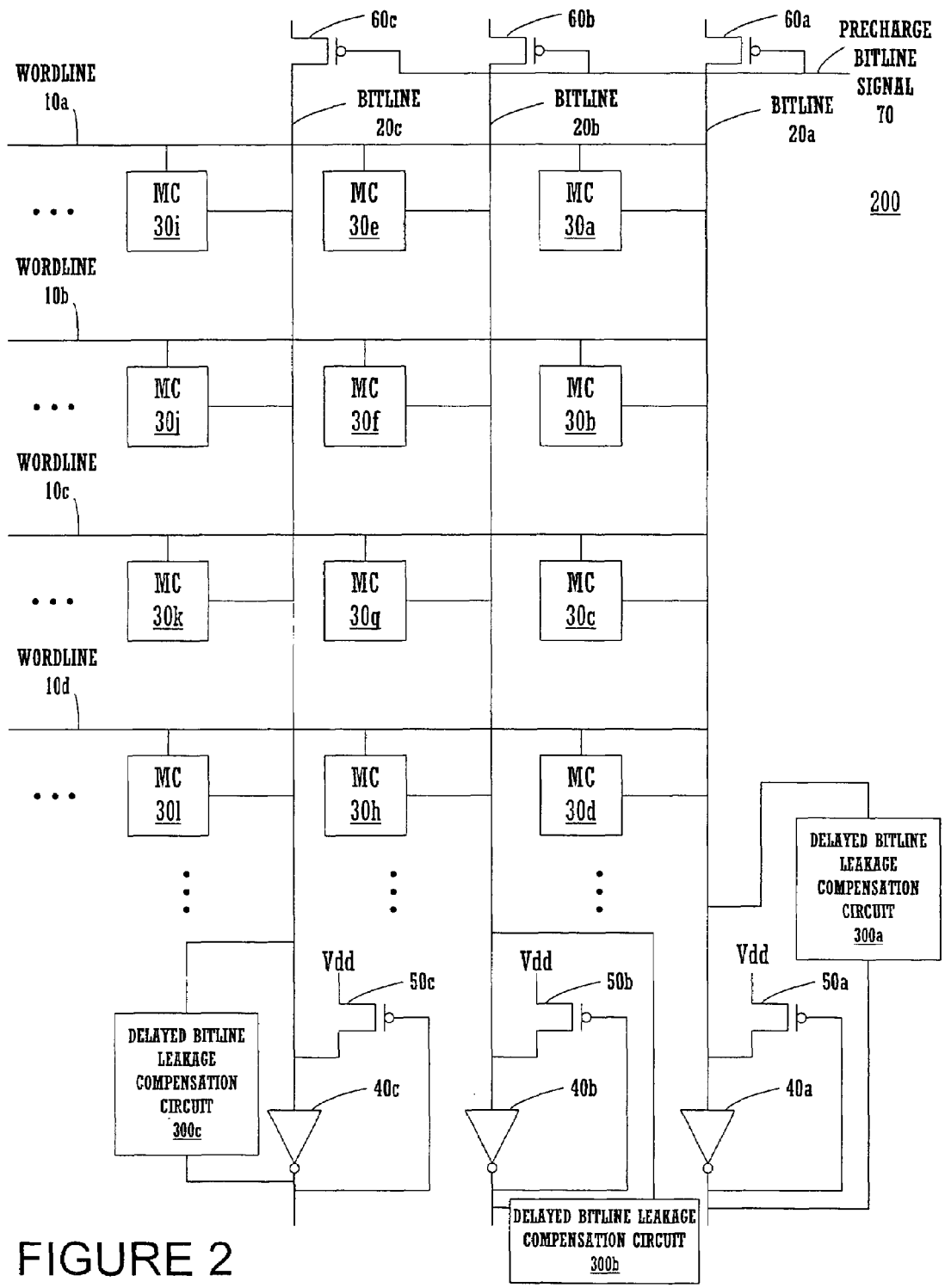
FIG. 2 illustrates a memory device in accordance with an embodiment of the present invention, showing delayed bitline leakage compensation circuits.

FIG. 2 illustrates a memory device 200 in accordance with an embodiment of the present invention, showing delayed bitline leakage compensation circuits 300a–300c. The memory device 200 includes the components (e.g., wordlines, bitlines, memory cells, precharge transistors, sense amplifiers, keeper transistors, etc.) described with respect to FIG. 1. Additionally, the memory device 200 has a plurality of delayed bitline leakage compensation circuits 300a–300c. Each delayed bitline leakage compensation circuit 300a–300c is coupled to a corresponding bitline and is coupled to the output of the corresponding sense amplifier.

A number of features characterize each delayed bitline leakage compensation circuit 300a–300c. First, the delayed bitline leakage compensation circuit 300a–300c avoids interfering with the read operation while preventing false outputs for the read operation. Secondly, the delayed bitline leakage compensation circuit 300a–300c utilizes a circuit that models the discharge of the bitline by leakage current instead of a selected memory cell in the read operation. As a result, greater tolerance to leakage current and to fabrication process variations is provided. Moreover, the memory device 200 is better tuned to fabrication process variations to avoid deterioration in performance.

Figure 3:
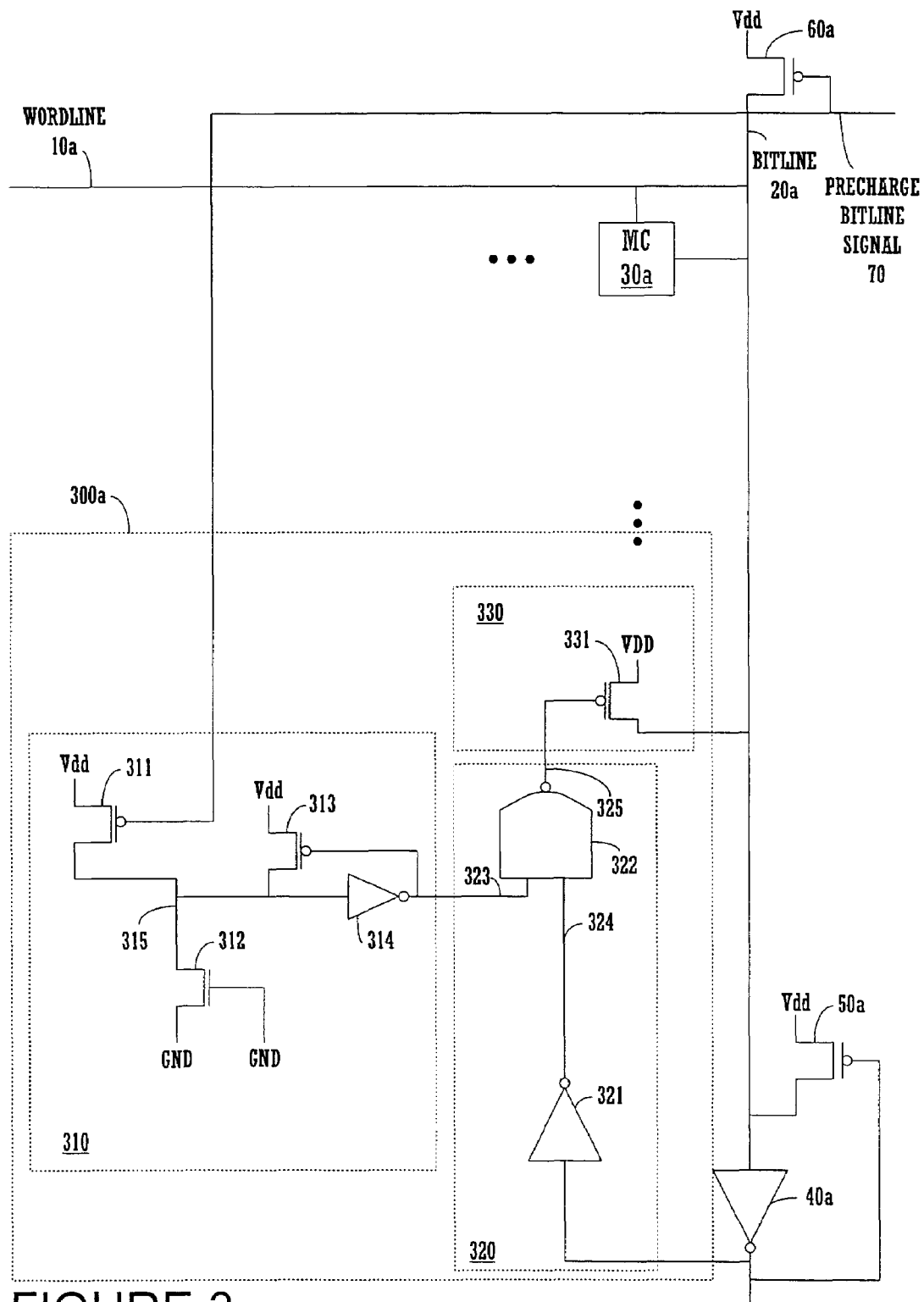
FIG. 3 illustrates a delayed bitline leakage compensation circuit in accordance with an embodiment of the present invention.

FIG. 3 illustrates a delayed bitline leakage compensation circuit 300a in accordance with an embodiment of the present invention. The delayed bitline leakage compensation circuits 300b–300c of FIG. 2 have a similar configuration.

As depicted in FIG. 3, the delayed bitline leakage compensation circuit 300a includes a bitline leakage model circuit 310, a delayed charge signal generator 320, and a delayed charge circuit 330. In another embodiment, the delayed bitline leakage compensation circuits 300a–300c share a single bitline leakage model circuit 310. In yet another embodiment, a first plurality of the delayed bitline leakage compensation circuits 300a–300c share a first bitline leakage model circuit while a second plurality of the delayed bitline leakage compensation circuits 300a–300c share a second bitline leakage model circuit. That is, the bitline leakage model circuit is shared by multiple delayed bitline leakage compensation circuits, reducing the number of bitline leakage model circuit needed.

The bitline leakage model circuit 310 models the discharge of the bitline 20a by leakage current instead of a selected memory cell (e.g., memory cell 30a) in a read operation. In an embodiment, the bitline leakage model circuit 310 has a first PMOS transistor 311, an NMOS transistor 312, a second PMOS transistor 313, and an inverter 314.

Continuing, the first PMOS transistor 311 models the precharge of the bitline 20a for the read operation. The first PMOS transistor 311 has a gate coupled to the precharge bitline signal 70, a source coupled to Vdd, and a drain coupled to node 315.

The NMOS transistor 312 models the leakage current discharging the bitline 20a. The NMOS transistor 312 has a source coupled to ground, a gate coupled to ground, and a drain coupled to node 315 (which is coupled to the drain of the first PMOS transistor 311). Generally, the NMOS transistor 312 is sized so that the bitline leakage model circuit 310 discharges at a greater rate than the bitline 20a is discharged by the leakage current to prevent a false output for the read operation. Additionally, the NMOS transistor 312 is sized so that the bitline leakage model circuit 310 discharges at a slower rate than the bitline 20a is discharged by the selected memory cell (e.g., memory cell 30a) to avoid interfering with the read operation. It should be understood that NMOS transistor 312 can be a plurality of NMOS transistors arranged in parallel, wherein each NMOS transistor has a source, gate, and a drain coupled as illustrated by NMOS transistor 312.

Further, the second PMOS transistor 313 models the keeper circuit 50a of the bitline 20a. The second PMOS transistor 313 has a source coupled to Vdd, a drain coupled to node 315 (which is coupled to the drain of the NMOS transistor 312), and a gate coupled to the output of the inverter 314.

The inverter 314 models the sense amplifier 40a of the bitline 20a. The inverter 314 includes an input coupled to node 315 (which is coupled to the drain of the NMOS transistor 312), and an output coupled to the gate of the second PMOS transistor 313 and coupled to the delayed charge signal generator 320. Here, the inverter 314 is utilized to model the sense amplifier 40a, which is implemented as an inverter. It should be understood that the bitline leakage model circuit 310 has a sensing circuit (e.g., inverter 314) that models the sense amplifier of the bitline. Implementation of this sensing circuit depends on the implementation of the sense amplifier.

Next, the delayed charge signal generator 320 generates a delayed charge signal 325 in response to the bitline leakage model circuit 310 discharging to approximately a discharge threshold. The delayed charge signal generator 320 is deactivated if the bitline 20a is discharged by the selected memory cell (e.g., memory cell 30a). In general, the discharge threshold is selected so that the delayed charge circuit 330 has sufficient time to turn on and to charge the bitline 20a to prevent a false output for the read operation. In an embodiment, the delayed charge signal generator 320 includes an inverter 321 and a NAND gate 322. The inverter 321 has an output coupled to an input 324 of the NAND gate 322, and an input coupled to the output of the sense amplifier 40a of the bitline 20a.

Moreover, the NAND gate 322 has a first input 323 coupled to the bitline leakage model circuit 310. In particular, the first input 323 is coupled to the output of the inverter 314. Also, the NAND gate 322 has a second input 324 coupled to the output of the inverter 321, and an output which outputs the delayed charge signal 325 and which is coupled to the delayed charge circuit 330.

Lastly, the delayed charge circuit 330 charges the bitline 20a in response to the delayed charge signal 325. In an embodiment, the delayed charge circuit 330 includes a PMOS transistor 331 for charging the bitline 20a. The PMOS transistor 331 has a gate coupled to the delayed charge signal generator 320 for receiving the delayed charge signal 325, a source coupled to Vdd, and a drain coupled to the bitline 20a.

Figure 4A:
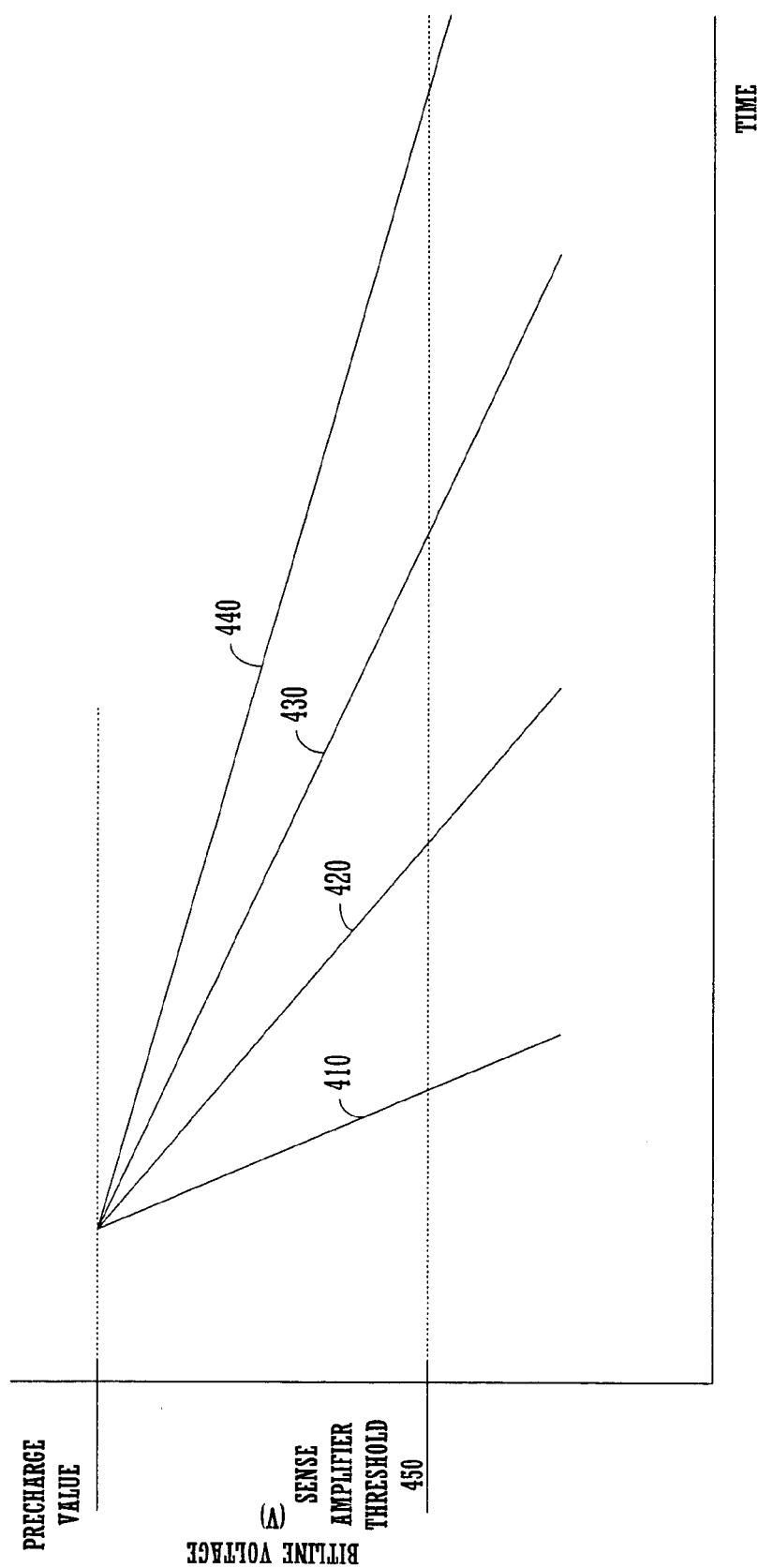
FIGS. 4A–4C illustrate various bitline discharge rates and operation of the delayed bitline leakage compensation circuit in accordance with an embodiment of the present invention.

FIG. 4A shows various bitline discharge rates in accordance with an embodiment of the present invention. It should be understood that the bitline 20a has been precharged for the read operation. The line 410 represents the bitline 20a being discharged by the selected memory cell (e.g., memory cell 30a) in the read operation. The line 420 represents the node 315 being discharged according to the bitline leakage model circuit 310. The line 430 represents the bitline 20a being discharged by leakage current under the worst case. That is, the worst case is the situation when the leakage current is the greatest in light of the fabrication process variations. The line 440 represents the bitline 20a being discharged by leakage current under the best case. That is, the best case is the situation when the leakage current is the smallest in light of the fabrication process variations.

Focusing on line 410, the sense amplifier 40a will change its output from a "0" (logic low) to a "1" (logic high) when the bitline 20a has been discharged to the sense amplifier threshold 450, providing a "1" output from the bitline 20a for the read operation. Similarly, when lines 430 and 440 cross the sense amplifier threshold 450, the sense amplifier 40a will change its output from a "0" (logic low) to a "1" (logic high), providing a false "1" output from the bitline 20a for the read operation. Thus, the line 420 is designed to be between lines 410 and 430 to avoid interfering with the read operation while preventing false outputs for the read operation. Since line 420 crosses the sense amplifier threshold 450 before lines 430 and 440, there is sufficient time margin to activate the delayed charge circuit 330 and to charge the bitline 20a before a false output is generated for the read operation. It should be understood that the discharge threshold of the bitline leakage model circuit 310 can be the same as, greater than, or less than the sense amplifier threshold. As described above, the delayed charge signal generator 320 generates the delayed charge signal 325 in response to the bitline leakage model circuit 310 discharging to approximately the discharge threshold, causing activation of the delayed charge circuit 330 to charge the bitline 20a.

Referring again to FIG. 3, the read operation will be first described for the case when the selected memory cell (e.g., memory cell 30a) discharges the bitline 20a.

In practice, a read operation request is received. The precharge bitline signal 70 is enabled (logic low state). This activates the precharge transistor 60a to precharge the bitline 20a to a predetermined value (e.g., "1" or logic high).

In addition, the precharge bitline signal 70 activates the bitline leakage model circuit 310 by turning on PMOS transistor 311 to charge node 315. Prior to receiving the precharge bitline signal 70, the NMOS transistor 312 and the PMOS transistors 311 and 313 are off while the node 315 is discharged.

After the precharge bitline signal 70 is disabled, the bitline 20a is at "1" (logic high). Thus, the output of the sense amplifier 40a is at "0" (logic low), turning on the keeper transistor 50a.

Similarly, the disabled precharge bitline signal 70 turns off the PMOS transistor 311, leaving the node 315 charged at "1" (logic high). Hence, the output of the inverter 314 is at "0" (logic low), turning on the PMOS transistor 313. However, the leakage current of the NMOS transistor 312 starts to discharge the node 315. With respect to the NAND gate 322, the input 324 is at "1" (logic high) and the input 323 is at "0" (logic low). Thus, the output of the NAND gate 322 is at "1" (logic high), keeping the PMOS transistor 331 in the off state.

Assuming the wordline 10a is enabled, the memory cell 30a is selected. The selected memory cell 30a starts discharging the bitline 20a. When the bitline 20a is discharged to the sense amplifier threshold, the sense amplifier 40a changes its output from a "0" (logic low) to a "1" (logic high), turning off the keeper transistor 50a. Moreover, with respect to the NAND gate 322, the input 324 becomes "0" (logic low) and the input 323 is at "0" (logic low). Thus, the output of the NAND gate 322 remains at "1" (logic high) irrespective of any change at the input 323 caused by the bitline leakage model circuit 310 discharging to approximately the discharge threshold, keeping the PMOS transistor 331 in the off state. That is, the delayed charge signal generator 320 is deactivated, preventing generation of the delayed charge signal (logic low state). Therefore, the "1" (logic high) output is provided from bitline 20a for the read operation.

Figure 4B:
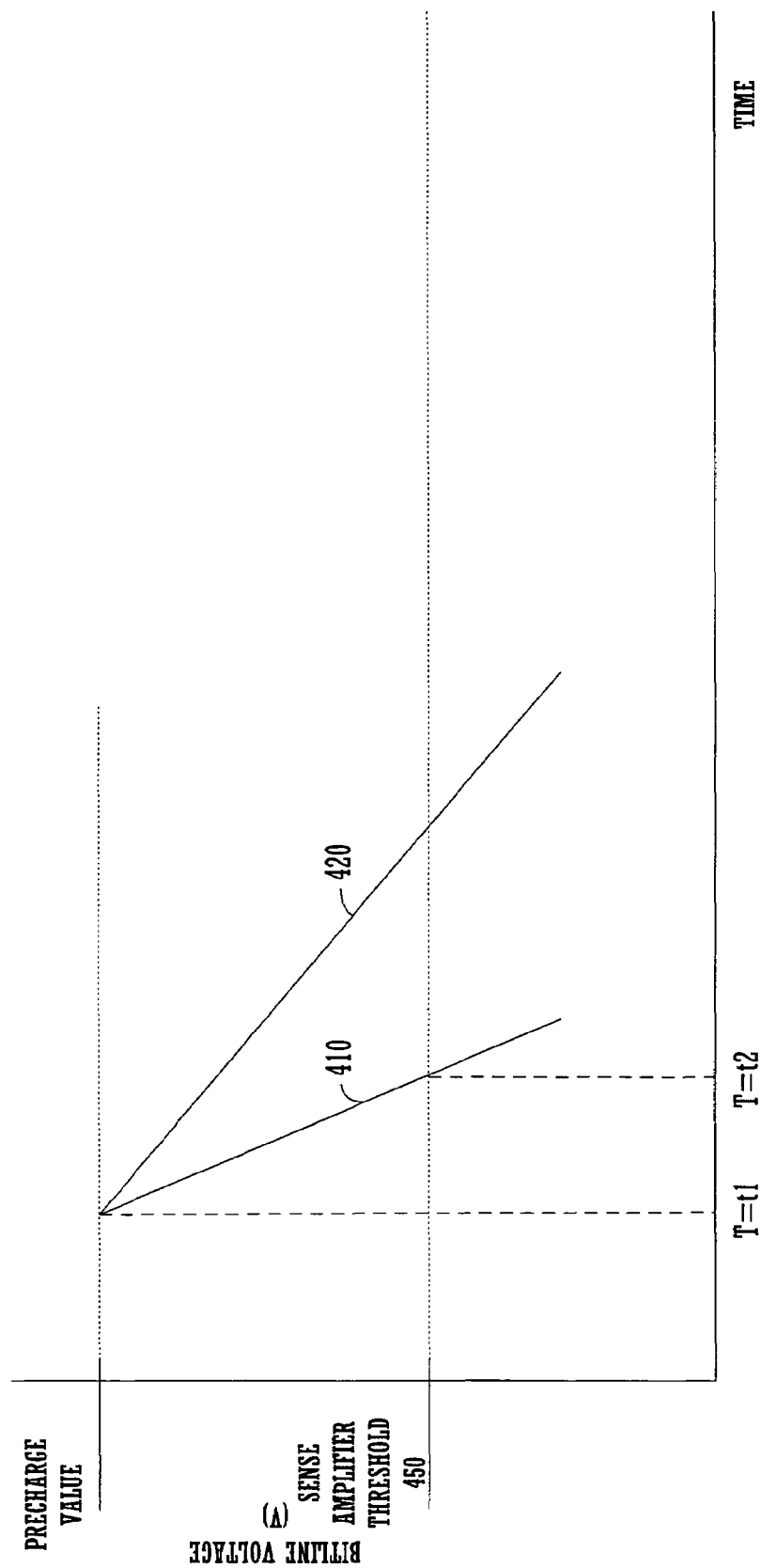

As shown in FIG. 4B, the line 410 represents the bitline 20a being discharged by the selected memory cell (e.g., memory cell 30a) in the read operation. The line 420 represents the node 315 being discharged according to the bitline leakage model circuit 310. At T=t1, the bitline 20a starts being discharged by the memory cell 30a and starts being discharged according to the bitline leakage model circuit 310. At T=t2, the sense amplifier 40a changes its output from a "0" (logic low) to a "1" (logic high), deactivating the delayed charge signal generator 320 to prevent generation of the delayed charge signal (logic low state) in this read operation.

Still referring to FIG. 3, the read operation will now be described for the case when the selected memory cell (e.g., memory cell 30a) does not discharge the bitline 20a.

A read operation request is received. The precharge bitline signal 70 is enabled (logic low state). This activates the precharge transistor 60a to precharge the bitline 20a to a predetermined value (e.g., "1" or logic high).

In addition, the precharge bitline signal 70 activates the bitline leakage model circuit 310 by turning on PMOS transistor 311 to charge node 315. Prior to receiving the precharge bitline signal 70, the NMOS transistor 312 and the PMOS transistors 311 and 313 are off while the node 315 is discharged.

After the precharge bitline signal 70 is disabled, the bitline 20a is at "1" (logic high). Thus, the output of the sense amplifier 40a is at "0" (logic low), turning on the keeper transistor 50a.

Similarly, the disabled precharge bitline signal 70 turns off the PMOS transistor 311, leaving the node 315 charged at "1" (logic high). Hence, the output of the inverter 314 is at "0" (logic low), turning on the PMOS transistor 313. However, the leakage current of the NMOS transistor 312 starts to discharge the node 315. With respect to the NAND gate 322, the input 324 is at "1" (logic high) and the input 323 is at "0" (logic low). Thus, the output of the NAND gate 322 is at "1" (logic high), keeping the PMOS transistor 331 in the off state.

Assuming the wordline 10a is enabled, the memory cell 30a is selected. The selected memory cell 30a does not discharge the bitline 20a. However, leakage current starts to discharge the bitline 20a. Meanwhile, the NMOS transistor 312 continues to discharge the node 315. When the node 315 is discharged to approximately the discharge threshold, the inverter 314 changes its output from a "0" (logic low) to a "1" (logic high), turning off PMOS transistor 313. Moreover, with respect to the NAND gate 322, the input 324 remains "1" (logic high) and the input 323 becomes "1" (logic high). Thus, the output of the NAND gate 322 becomes "0" (logic low). That is, the delayed charge signal generator 320 generates the delayed charge signal (logic low state), turning on the PMOS transistor 331 to charge the bitline 20a. Therefore, the "0" (logic low) output is provided from bitline 20a for the read operation.

Figure 4C:
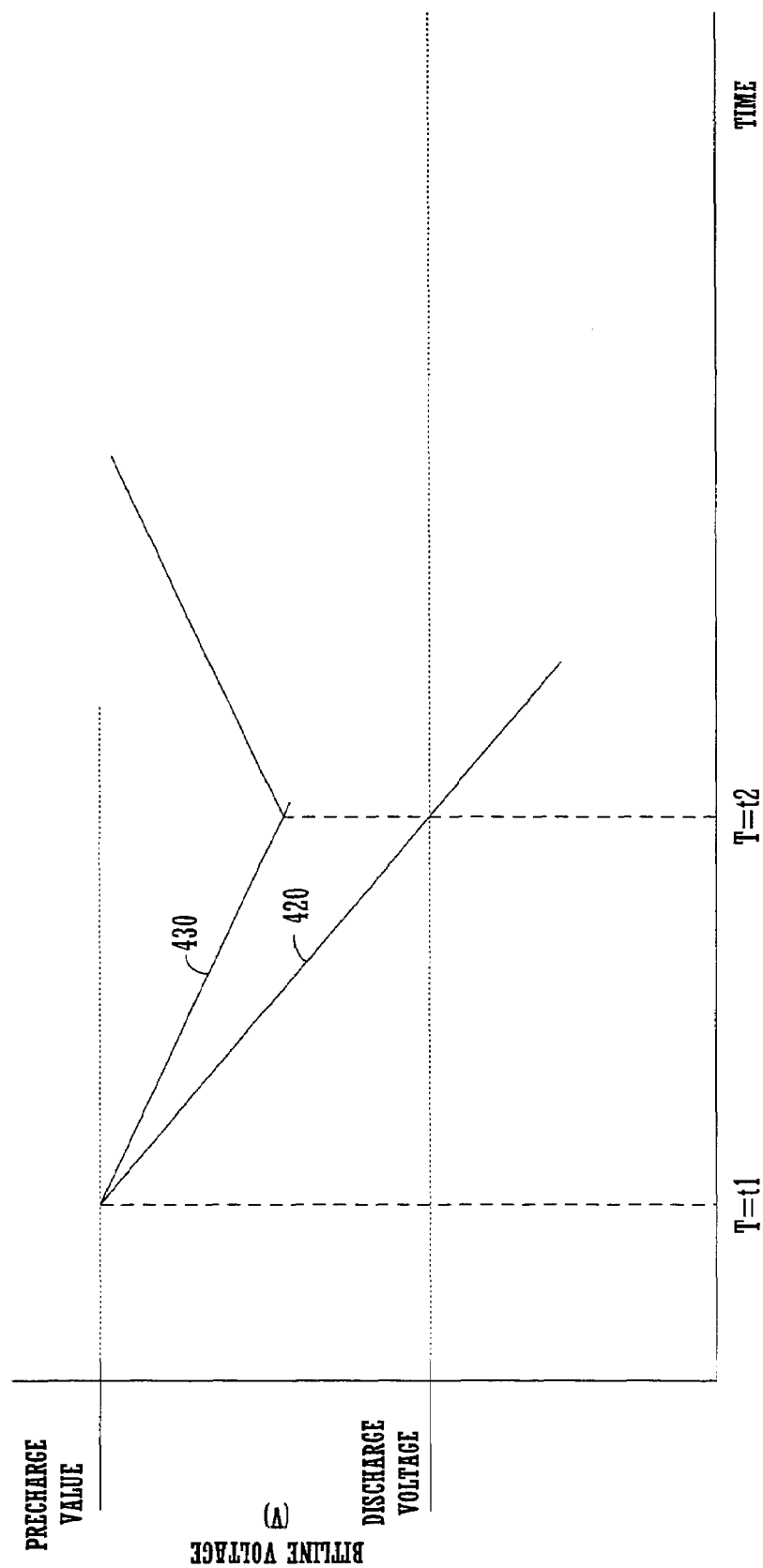

As shown in FIG. 4C, the line 420 represents the bitline node 315 being discharged according to the bitline leakage model circuit 310. The line 430 represents the bitline 20a being discharged by leakage current in the read operation. At T=t1, the bitline 20a starts being discharged by the leakage current and node 315 starts being discharged according to the bitline leakage model circuit 310. At T=t2, the bitline leakage model circuit 310 discharges to approximately a discharge threshold, activating the delayed charge signal generator 320 to generate the delayed charge signal (logic low state) in this read operation. The delayed charge signal turns on the PMOS transistor 331 to charge the bitline 20a.

Figure 5:
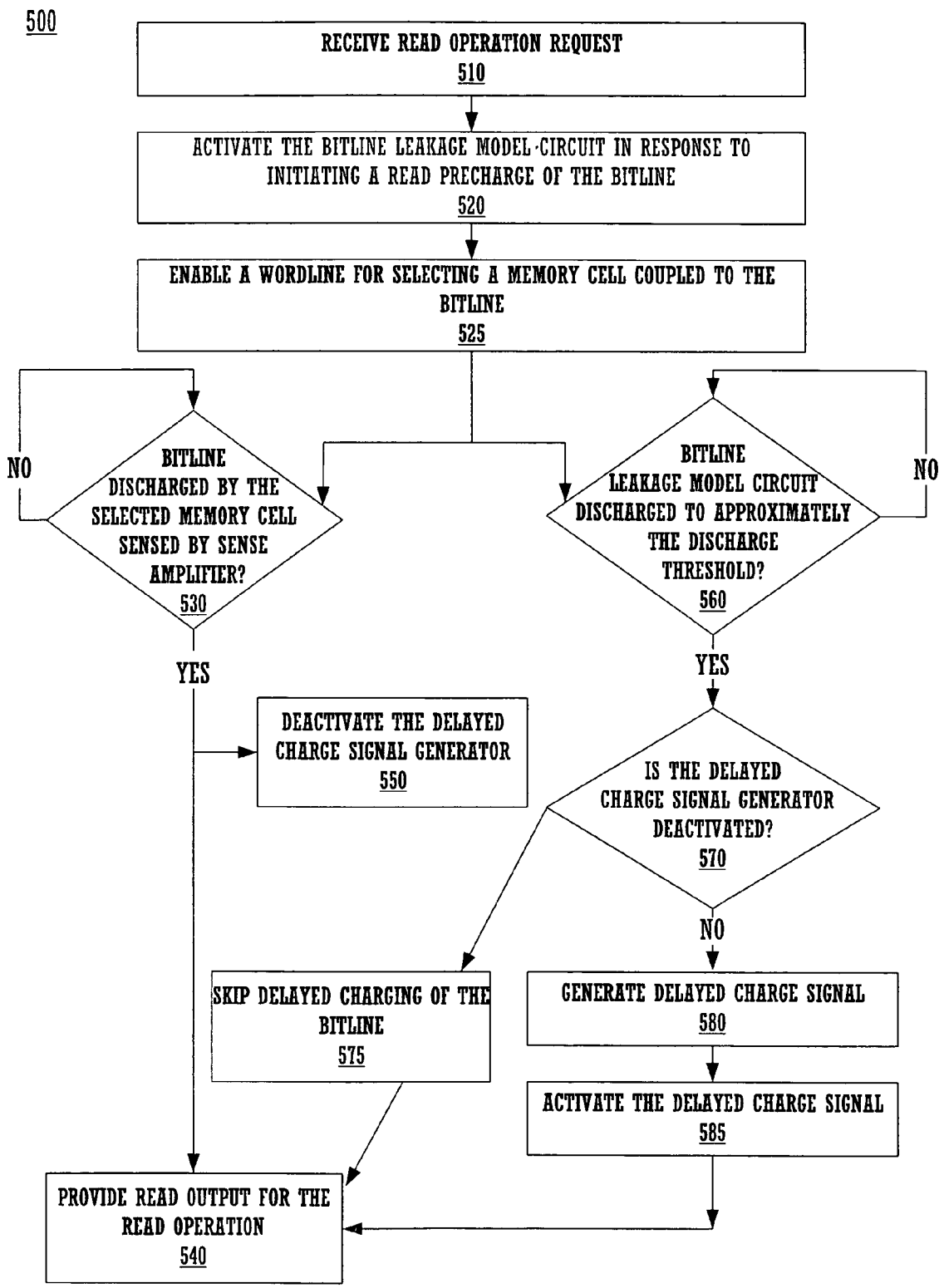
FIG. 5 illustrates a flow chart showing a method of compensating for leakage that discharges a bitline in accordance with an embodiment of the present invention.

FIG. 5 illustrates a flow chart showing a method 500 of compensating for leakage that discharges a bitline in accordance with an embodiment of the present invention.

At Step 510, a read operation request is received. A bitline leakage model circuit is activated in response to initiating a read precharge of the bitline, at Step 520.

Continuing at Step 525, after termination of the read precharge of the bitline, a wordline is enabled for selecting a memory cell coupled to the bitline. Thereafter, Steps 530 and 560 are performed in parallel. At Step 530, it is determined whether the bitline discharged by the selected memory cell is sensed by the sense amplifier of the bitline. While the sense amplifier does not sense the bitline discharged by the selected memory cell, the method remains at step 530. Otherwise the method 500 continues to Steps 550 and 540. At Step 550, the delayed charge signal generator is deactivated. Further, at Step 540, the read output is provided for the read operation.

At Step 560, it is determined whether the bitline leakage model circuit has discharged to approximately the discharge threshold. While the bitline leakage model circuit does not discharge to approximately the discharge threshold, the method remains at step 560. Otherwise, the method 500 continues to Step 570. At Step 570, it is determined whether the delayed charge signal generator is deactivated. If the delayed charge signal generator is deactivated, it is determined that there is no need for the delayed charging of the bitline, at Step 575. Continuing, at Step 540, the read output is provided for the read operation.

Otherwise, the method continues to Step 580. At Step 580, the delayed charge signal generator generates the delayed charge signal. The delayed charge signal activates the delayed charge circuit to charge the bitline, at Step 585. Further, at Step 540, the read output is provided for the read operation.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit comprising:
   a bitline leakage model circuit for modeling discharge of a bitline by leakage current in a read operation;
   a delayed charge signal generator for generating a delayed charge signal in response to said bitline leakage model circuit discharging to approximately a discharge threshold, wherein said delayed charge signal generator is deactivated if said bitline is discharged by a selected memory cell; and
   a delayed charge circuit for charging said bitline in response to said delayed charge signal.

2. The circuit as recited in claim 1 wherein said bitline leakage model circuit comprises:
   a first PMOS transistor for modeling precharge of said bitline for said read operation, wherein said first PMOS transistor has a gate coupled to a precharge bitline signal, a source, and a drain;
   one or more NMOS transistors for modeling leakage current discharging said bitline, wherein each NMOS transistor has a source coupled to ground, a gate coupled to ground, and a drain coupled to said drain of said first PMOS transistor;
   a second PMOS transistor for modeling a keeper circuit of said bitline, wherein said second PMOS transistor has a source, a drain coupled to said drain of each NMOS transistor, and a gate; and
   a sensing circuit for modeling a sense amplifier of said bitline, wherein said sensing circuit includes an input coupled to said drain of each NMOS transistor, and an output coupled to said gate of said second PMOS transistor and coupled to said delayed charge signal generator.

3. The circuit as recited in claim 2 wherein said one or more NMOS transistors are sized so that said bitline leakage model circuit discharges at a greater rate than said bitline is discharged by said leakage current to prevent a false output for said read operation.

4. The circuit as recited in claim 2 wherein said one or more NMOS transistors are sized so that said bitline leakage model circuit discharges at a slower rate than said bitline is discharged by said selected memory cell to avoid interfering with said read operation.

5. The circuit as recited in claim 1 wherein said discharge threshold is selected so that said delayed charge circuit has sufficient time to turn on and to charge said bitline to prevent a false output for said read operation.

6. The circuit as recited in claim 1 wherein said delayed charge signal generator comprises:
   an inverter having an output and an input coupled to an output of a sense amplifier of said bitline; and
   a NAND gate having a first input coupled to said bitline leakage model circuit, a second input coupled to said output of said inverter, and an output for outputting said delayed charge signal and which is coupled to said delayed charge circuit.

7. The circuit as recited in claim 1 wherein said delayed charge circuit comprises:
   a PMOS transistor for charging said bitline, wherein said PMOS transistor has a gate coupled to said delayed charge signal generator for receiving said delayed charge signal, a source, and a drain coupled to said bitline.

8. A memory device comprising:
   a memory array having a plurality of memory cells;
   a plurality of bitlines, each coupled to a portion of said memory array;
   a plurality of sense amplifiers, each having an input and an output, wherein said input of each sense amplifier is coupled to one or more bitlines; and
   a plurality of delayed bitline leakage compensation circuits, each coupled to a corresponding bitline and coupled to an output of a corresponding sense amplifier, wherein each delayed bitline leakage compensation circuit comprises:
  a bitline leakage model circuit for modeling discharge of said corresponding bitline by leakage current in a read operation;
  a delayed charge signal generator for generating a delayed charge signal in response to said bitline leakage model circuit discharging to approximately a discharge threshold, wherein said delayed charge signal generator is deactivated if said corresponding bitline is discharged by a selected memory cell; and
  a delayed charge circuit for charging said corresponding bitline in response to said delayed charge signal.

9. The memory device as recited in claim 8 further comprising:
  a plurality of keeper circuits, each coupled to a corresponding bitline and coupled to an output of a corresponding sense amplifier;
  a plurality of wordlines, each wordline coupled to a portion of said memory array; and
  a plurality of precharge bitline circuits coupled to said bitlines and receiving a precharge bitline signal.

10. The memory device as recited in claim 8 wherein said bitline leakage model circuit comprises:
  a first PMOS transistor for modeling precharge of said corresponding bitline for said read operation, wherein said first PMOS transistor has a gate coupled to a precharge bitline signal, a source, and a drain;
  one or more NMOS transistors for modeling leakage current discharging said corresponding bitline, wherein each NMOS transistor has a source coupled to ground, a gate coupled to ground, and a drain coupled to said drain of said first PMOS transistor;
  a second PMOS transistor for modeling a keeper circuit of said corresponding bitline, wherein said second PMOS transistor has a source, a drain coupled to said drain of each NMOS transistor, and a gate; and
  a sensing circuit for modeling corresponding sense amplifier of said corresponding bitline, wherein said sensing circuit includes an input coupled to said drain of each NMOS transistor, and an output coupled to said gate of said second PMOS transistor and coupled to said delayed charge signal generator.

11. The memory device as recited in claim 10 wherein said one or more NMOS transistors are sized so that said bitline leakage model circuit discharges at a greater rate than said corresponding bitline is discharged by said leakage current to prevent a false output for said read operation.

12. The memory device as recited in claim 10 wherein said one or more NMOS transistors are sized so that said bitline leakage model circuit discharges at a slower rate than said corresponding bitline is discharged by said selected memory cell to avoid interfering with said read operation.

13. The memory device as recited in claim 8 wherein said discharge threshold is selected so that said delayed charge circuit has sufficient time to turn on and to charge said corresponding bitline to prevent a false output for said read operation.

14. The memory device as recited in claim 8 wherein said delayed charge signal generator comprises:
  an inverter having an output and an input coupled to said output of said corresponding sense amplifier of said corresponding bitline; and
  a NAND gate having a first input coupled to said bitline leakage model circuit, a second input coupled to said output of said inverter, and an output for outputting said delayed charge signal and which is coupled to said delayed charge circuit.

15. The memory device as recited in claim 8 wherein said delayed charge circuit comprises:
  a PMOS transistor for charging said corresponding bitline, wherein said PMOS transistor has a gate coupled to said delayed charge signal generator for receiving said delayed charge signal, a source, and a drain coupled to said corresponding bitline.

16. A method of compensating for leakage that discharges a bitline, said method comprising:
  modeling discharge of said bitline by leakage current in a read operation using a circuit;
  activating said circuit in response to initiating a read precharge of said bitline;
  if said bitline is discharged by said leakage current, generating a signal in response to said circuit discharging to approximately a discharge threshold and activating a delayed charge circuit with said signal to charge said bitline; and
  if said bitline is discharged by a selected memory cell, sensing output for said read operation from said bitline and deactivating generation of said signal.

17. The method as recited in claim 16 wherein said circuit comprises:
  a first PMOS transistor for modeling precharge of said bitline for said read operation, wherein said first PMOS transistor has a gate coupled to a precharge bitline signal for activating said circuit and said bitline, a source, and a drain;
  one or more NMOS transistors for modeling leakage current discharging said bitline, wherein each NMOS transistor has a source coupled to ground, a gate coupled to ground, and a drain coupled to said drain of said first PMOS transistor;
  a second PMOS transistor for modeling a keeper circuit of said bitline, wherein said second PMOS transistor has a source, a drain coupled to said drain of each NMOS transistor, and a gate; and
  a sensing circuit for modeling a sense amplifier of said bitline, wherein said sensing circuit includes an input coupled to said drain of each NMOS transistor, and an output coupled to said gate of said second PMOS transistor and coupled to a delayed charge signal generator that generates said signal.

18. The method as recited in claim 17 wherein said one or more NMOS transistors are sized so that said bitline leakage model circuit discharges at a greater rate than said bitline is discharged by said leakage current to prevent a false output for said read operation.

19. The method as recited in claim 17 wherein said one or more NMOS transistors are sized so that said bitline leakage model circuit discharges at a slower rate than said bitline is discharged by said selected memory cell to avoid interfering with said read operation.

20. The method as recited in claim 16 wherein said discharge threshold is selected so that said delayed charge circuit has sufficient time to turn on and to charge said bitline to prevent a false output for said read operation.

21. The method as recited in claim 16 wherein a delayed charge signal generator generates said signal and comprises:
  an inverter having an output, and an input coupled to an output of a sense amplifier of said bitline; and
  a NAND gate having a first input coupled to said circuit, a second input coupled to said output of said inverter, and an output for outputting said signal and which is coupled to said delayed charge circuit.

22. The method as recited in claim 21 wherein said delayed charge circuit comprises:
   a PMOS transistor for charging said bitline, wherein said PMOS transistor has a gate coupled to said delayed charge signal generator for receiving said signal, a source, and a drain coupled to said bitline.

23. A memory device comprising:
   a memory array having a plurality of memory cells;
   a plurality of bitlines, each coupled to a portion of said memory array;
   a plurality of sense amplifiers, each having an input and an output, wherein said input of each sense amplifier is coupled to one or more bitlines; and
   a plurality of delayed bitline leakage compensation circuits, each coupled to a corresponding bitline and coupled to an output of a corresponding sense amplifier, wherein at least one of said delayed bitline leakage compensation circuits comprises:
      a bitline leakage model circuit for modeling discharge of a bitline by leakage current in a read operation.

24. The memory device as recited in claim 23 further comprising:
   a plurality of keeper circuits, each coupled to a corresponding bitline and coupled to an output of a corresponding sense amplifier;
   a plurality of wordlines, each wordline coupled to a portion of said memory array; and
   a plurality of precharge bitline circuits coupled to said bitlines and receiving a precharge bitline signal.

25. The memory device as recited in claim 23 wherein each delayed bitline leakage compensation circuit comprises:
   said bitline leakage model circuit;
   a delayed charge signal generator for generating a delayed charge signal in response to said bitline leakage model circuit discharging to approximately a discharge threshold, wherein said delayed charge signal generator is deactivated if said corresponding bitline is discharged by a selected memory cell; and
   a delayed charge circuit for charging said corresponding bitline in response to said delayed charge signal.

26. The memory device as recited in claim 25 wherein said bitline leakage model circuit comprises:
   a first PMOS transistor for modeling precharge of said bitline for said read operation, wherein said first PMOS transistor has a gate coupled to a precharge bitline signal, a source, and a drain;
   one or more NMOS transistors for modeling leakage current discharging said bitline, wherein each NMOS transistor has a source coupled to ground, a gate coupled to ground, and a drain coupled to said drain of said first PMOS transistor;
   a second PMOS transistor for modeling a keeper circuit of said bitline, wherein said second PMOS transistor has a source, a drain coupled to said drain of each NMOS transistor, and a gate; and
   a sensing circuit for modeling corresponding sense amplifier of said bitline, wherein said sensing circuit includes an input coupled to said drain of each NMOS transistor, and an output coupled to said gate of said second PMOS transistor and coupled to said delayed charge signal generator.

27. The memory device as recited in claim 26 wherein said one or more NMOS transistors are sized so that said bitline leakage model circuit discharges at a greater rate than said bitline is discharged by said leakage current to prevent a false output for said read operation.

28. The memory device as recited in claim 26 wherein said one or more NMOS transistors are sized so that said bitline leakage model circuit discharges at a slower rate than said bitline is discharged by said selected memory cell to avoid interfering with said read operation.

29. The memory device as recited in claim 25 wherein said discharge threshold is selected so that said delayed charge circuit has sufficient time to turn on and to charge said corresponding bitline to prevent a false output for said read operation.

30. The memory device as recited in claim 25 wherein said delayed charge signal generator comprises:
   an inverter having an output and an input coupled to said output of said corresponding sense amplifier of said corresponding bitline; and
   a NAND gate having a first input coupled to said bitline leakage model circuit, a second input coupled to said output of said inverter, and an output for outputting said delayed charge signal and which is coupled to said delayed charge circuit.

31. The memory device as recited in claim 25 wherein said delayed charge circuit comprises:
   a PMOS transistor for charging said corresponding bitline, wherein said PMOS transistor has a gate coupled to said delayed charge signal generator for receiving said delayed charge signal, a source, and a drain coupled to said corresponding bitline.

32. The memory device as recited in claim 23 further comprising a first plurality of bitline leakage model circuits for modeling discharge of a bitline by leakage current in said read operation, wherein said first plurality is smaller than said plurality of delayed bitline leakage compensation circuits.

33. The memory device as recited in claim 32 wherein each delayed bitline leakage compensation circuit comprises:
   one selected from said first plurality of bitline leakage model circuits and said bitline leakage model circuit;
   a delayed charge signal generator for generating a delayed charge signal in response to said selected bitline leakage model circuit discharging to approximately a discharge threshold, wherein said delayed charge signal generator is deactivated if said corresponding bitline is discharged by a selected memory cell; and
   a delayed charge circuit for charging said corresponding bitline in response to said delayed charge signal.

34. The memory device as recited in claim 33 wherein each bitline leakage model circuit comprises:
   a first PMOS transistor for modeling precharge of said bitline for said read operation, wherein said first PMOS transistor has a gate coupled to a precharge bitline signal, a source, and a drain;
   one or more NMOS transistors for modeling leakage current discharging said bitline, wherein each NMOS transistor has a source coupled to ground, a gate coupled to ground, and a drain coupled to said drain of said first PMOS transistor;
   a second PMOS transistor for modeling a keeper circuit of said bitline, wherein said second PMOS transistor has a source, a drain coupled to said drain of each NMOS transistor, and a gate; and
   a sensing circuit for modeling corresponding sense amplifier of said bitline, wherein said sensing circuit includes an input coupled to said drain of each NMOS transistor, and an output coupled to said gate of said second PMOS transistor and coupled to said delayed charge signal generator.

35. The memory device as recited in claim 34 wherein said one or more NMOS transistors are sized so that each bitline leakage model circuit discharges at a greater rate than said bitline is discharged by said leakage current to prevent a false output for said read operation.

36. The memory device as recited in claim 34 wherein said one or more NMOS transistors are sized so that each bitline leakage model circuit discharges at a slower rate than said bitline is discharged by said selected memory cell to avoid interfering with said read operation.

37. The memory device as recited in claim 33 wherein said discharge threshold is selected so that said delayed charge circuit has sufficient time to turn on and to charge said corresponding bitline to prevent a false output for said read operation.

38. The memory device as recited in claim 33 wherein said delayed charge signal generator comprises:

an inverter having an output and an input coupled to said output of said corresponding sense amplifier of said corresponding bitline; and a NAND gate having a first input coupled to one selected from said first plurality of bitline leakage model circuits and said bitline leakage model circuit, a second input coupled to said output of said inverter, and an output for outputting said delayed charge signal and which is coupled to said delayed charge circuit.

39. The memory device as recited in claim 33 wherein said delayed charge circuit comprises:

a PMOS transistor for charging said corresponding bitline, wherein said PMOS transistor has a gate coupled to said delayed charge signal generator for receiving said delayed charge signal, a source, and a drain coupled to said corresponding bitline.

* * * * *